United States Patent [19]

Lychyk et al.

[11] 4,272,140
[45] Jun. 9, 1981

[54] ARRANGEMENT FOR MOUNTING DUAL-IN-LINE PACKAGED INTEGRATED CIRCUITS TO THICK/THIN FILM CIRCUITS

[75] Inventors: George S. Lychyk, River Forest; Wayne E. Neese, Hoffman Estates, both of Ill.

[73] Assignee: GTE Automatic Electric Laboratories Incorporated, Northlake, Ill.

[21] Appl. No.: 105,180

[22] Filed: Dec. 19, 1979

[51] Int. Cl.³ .............................................. H05K 1/12
[52] U.S. Cl. .............................................. 339/17 CF
[58] Field of Search ........ 339/17 CF, 75 MP, 76 MP; 174/52 FP; 361/405

[56] References Cited

U.S. PATENT DOCUMENTS 4,089,575  5/1978  Grabbe .......................... 339/17 CF

FOREIGN PATENT DOCUMENTS 7500568  7/1976  Netherlands ...................... 339/17 CF
1152765  5/1969  United Kingdom ................ 339/17 CF

*Primary Examiner*—Neil Abrams
*Attorney, Agent, or Firm*—Robert J. Black; Anthony Miologos

[57] ABSTRACT

An arrangement for mounting a dual-in-line packaged integrated circuit (DIP) to a thick/thin film circuit wherein a portion of each DIP lead is formed into a U-shape including a horizontal foot portion. The arrangement further includes a complementary socket which accepts the U-shaped DIP leads in opposite sides thereof. The socket is then soldered to either a thick/thin film circuit of a circuit board.

7 Claims, 5 Drawing Figures

ARRANGEMENT FOR MOUNTING DUAL-IN-LINE PACKAGED INTEGRATED CIRCUITS TO THICK/THIN FILM CIRCUITS

BACKGROUND OF THE INVENTION (1) Field of the Invention

This invention relates in general to dual-in-line packaged integrated circuits and more particularly to an arrangement for mounting dual-in-line packaged integrated circuits to thick/thin film circuits.

(2) Description of the Prior Art

Dual-in-line packages (DIP) comprise a fairly standardized means of packaging circuit elements which can consist of anything from a plurality of discrete circut components to a large scale integrated circuit chip. The DIP package consists of a main plastic body having two rows of terminals extending from the side thereof and bent downwardly. These external leads are usually spaced about 0.100 inches apart and with the two rows being spaced approximately 0.300 inches apart. The number of leads or terminals in each row of the DIP vary greatly, depending upon the contents of a DIP package.

The art of mounting a DIP package on a printed circuit board or a thin/thick film circuit has long been known to involve two basic design considerations. The first of these design considerations is to provide a reliable electrical connection, and the second to mount the DIP package using a minimum amount of space.

In the first instance, each of the DIP's leads are formed into a foot portion which are soldered to an individual conductor pad found on the thick/thin film circuit or circuit board. This method although providing for a reliable electrical connection requires a large amount of space between the conductive pads.

In the second instance a DIP may be mounted to a socket which socket in turn is soldered to plated through bores on a circuit board such as sockets disclosed in U.S. Pat. Nos. 4,060,296 to Kunkle et al, 4,052,117 to Tengler et al and 4,072,380 to Freehauf. The sockets taught above are bulky and are normally used only with printed circuit boards. Presently, there are no sockets available for mounting a DIP to a thick/thin film circuit.

Therefore, it is an object of the present invention to provide a simple effective means of mounting a dual-in-line integrated package to thick/thin film film circuit or a circuit board, which can provide a reliable electrical connection and use a minimum amount of space.

SUMMARY OF THE INVENTION

In accomplishing the object of the present invention, a dual-in-line integrated package or DIP includes a plurality of legs emanating from opposite sides of the DIP with each leg extending downwardly from a fixed end within the package to a free end away from the package. The invention contemplates, the forming of each lead free end into a U-shaped form including a semi-circular portion oriented inwardly towards the package and terminating in a foot portion. The extreme end of the foot portion does not extend beyond the downward component of each individual lead. Thus each DIP lead may be soldered to respective conductive pads on either a circuit board or a thin/thick film circuit with a minimum amount of spacing between respective and opposite pads. The formed legs also allow the solder joints to be visible for easy inspection and allows for flexure at the point where the terminals are formed. Thus, the U-shaped forms compensate for unequal expansion of the DIP leads caused by temperature differentials between the leads, which might effect the quality of the solder connection.

The invention further provides for installing the semi-circular formed portions of the DIP leads onto a complementary socket which in turn is soldered to either a thin/thick film circuit or a circuit board. The socket is comprised of a plurality of terminal leads which in a first instance are vertical and adapted to be mounted into plated through bores of a printed circuit board or in a second instance formed into horizontal foot portions which are intended to be solder to conductive pads on a thick/thin film circuit. The socket further includes semicircular openings corresponding to each of the DIP's semicircular leads portions adjacent a different one of the terminals. After the socket is mounted to either a thin/thick film circuit or a printed circuit board the DIP is mounted to the socket by placing the DIP on top of the socket allowing each of the DIP's semicircular formed leads to enter a different one of the formed openings on the socket and making contact with a respective terminal. Thus, allowing for easy installation and removal of the DIP from the circuit.

BRIEF DESCRIPTION OF THE DRAWINGS

A better understanding of the invention may be had from the consideration of the following detailed description taken in conjunction with the accompanying drawings in which.

DESCRIPTION OF THE PREFERRED EMBODIMENT

Figure 1:
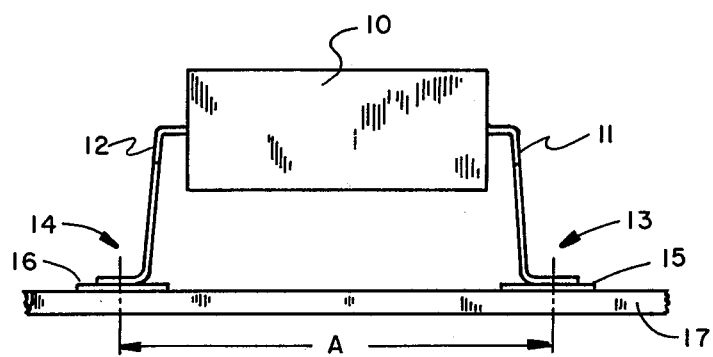
FIG. 1 is an end elevational view of a dual-in-line integated circuit package having its leads formed in the manner common in the art.

Referring now to the accompanying drawings of the present invention, FIG. 1 illustrates a typical dual-in-line integated circuit package (DIP). The DIP is comprised of a main plastic body 10 and two rows of conductive leads 11 and 12. The leads extend from opposite sides of the body 10 and each lead includes a fixed end communicating with an integated circuit within the body and a free end. In the present state of the art the free end of the leads shown generally as 13 and 14 are formed into a horizontal foot portion. The foot portions are then typically soldered to individual and respective conductive pads 15, 16 on a substrate 17. The typical on center spacing required between pads 15 and 16 and shown as A is approximately 0.400 inch.

Figure 2:
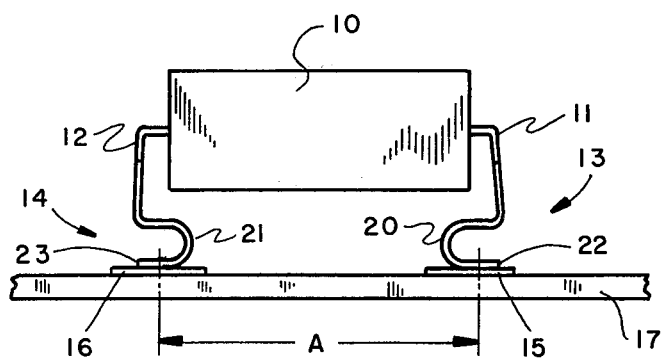
FIG. 2 is an end elevational view of a dual-in-line integated circuit package having its leads formed in accordance with the present invention described herein.

Turning now to FIG. 2, the arrangement of the present invention is illustrated. As previously discussed the DIP is comprised of a plastic body 10 and a row of conductive leads 11 and 12 emanating from opposite sides of the body. The free ends of legs 11 and 12 shown generally as 13 and 14 respectively are formed into U-shaped forms including semicircular portions 20 and 21 and foot portions 22 and 23. The extreme end of each foot portion 22 and 23 does not project beyond each of its respective lead 11 and 12. Foot portions 22 and 23 may then be soldered to respective conductive pads 15 and 16 on a substrate 17. As can be readily seen the U-shaped configuration of the lead free ends allows for a closer spacing of the conductive pads 15 and 16. The on center spacing between the conductive pads shown as A is approximately 0.240 inch. Thus the U-shaped formed leads require less area for mounting the DIP, as well as allowing the soldered joints to be visible for easy inspection. The U-shaped leads further allow conformal mounting of the DIP as some flexing can occur at the point where the terminals are formed and compensation for unequal expansion of DIP leads caused by temperature differentials between the leads, which may effect the quality of the solder connection.

In many applications it is desirable to be able to easily replace a DIP on a thick/thin film circuit or remove it, if it ever becomes defective. Due to the density and fragility of such circuits desoldering operations to remove the DIP may damage the circuit.

Figure 3:
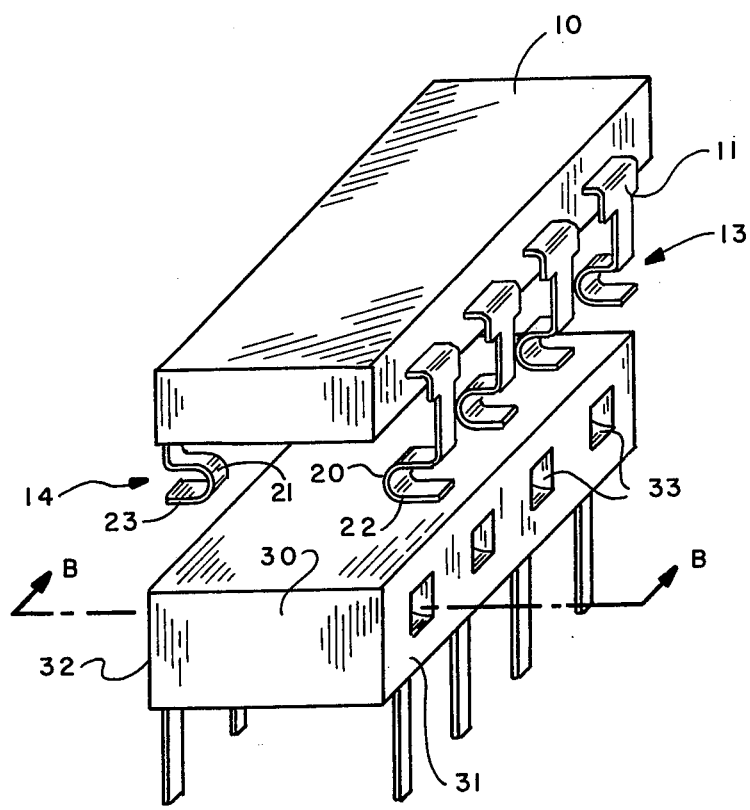
FIG. 3 is an oblique view of the dual-in-line integated circuit package and complementary socket in accordance with the present invention described herein.

Accordingly, turning to FIG. 3 the complementary socket of the present invention used with the formed leads of the DIP is illustrated. Generally the socket is comprised of a plastic body 30 including vertical sides 31 and 32. Each of sides 31 and 32 include a plurality of apertures 33, 34 (not shown) respectively thereon, which equal the amount of leads present on the DIP. Each aperture 33 of side 31 is disposed to accept a different one of semicircular lead portion 20 therein and likewise each aperture 34 of side 32 to accept a lead portion 21 therein.

Figure 4:
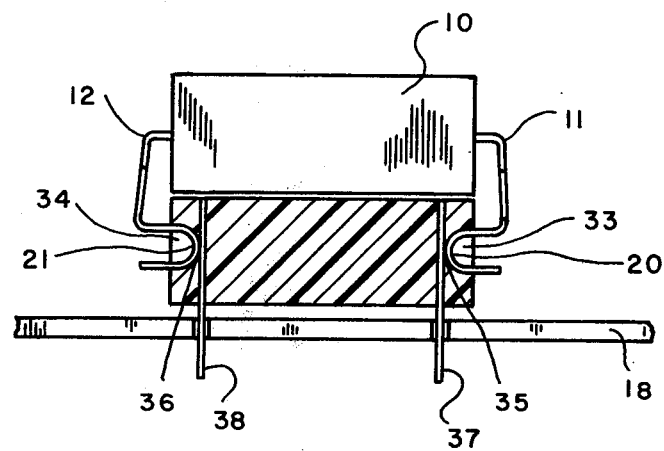
FIG. 4 is an end elevational view of the dual-in-line integated circuit package mounted to its complementary socket, with the socket shown in section taken substantially along line B—B of FIG. 3.

FIG. 4 illustrates the manner in which apertures 33, 34 accepts respective leads 11, 12 therein. As can be readily seen the inner wall of each aperture 33, 34 is semicircular in form conforming to lead portions 20, 21 respectively. An opening in the inner wall 35, 36 allows each lead portion 20, 21 to contact one of respective conductive terminals 37, 38 and make an electrical connection thereat. Due to the inherent spring action of the DIP leads good electrical contact is maintained between the DIP leads and the socket terminal as well as providing a mechanical interlock of the DIP to the socket. For mounting on a circuit board 18, the socket terminals 37, 38 which extend vertically from the bottom face of the socket are inserted into respective plated through bores and soldered thereat.

Figure 5:
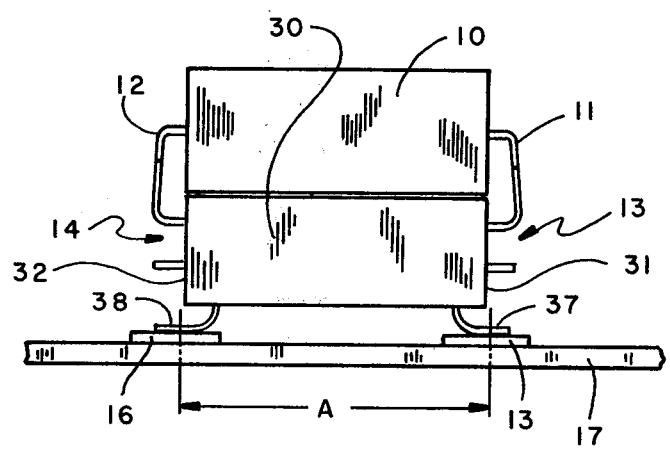
FIG. 5 is an end elevational view of the dual-in-line integated circuit package mounted to its complementary socket with the socket terminals formed for mounting on thick/thin film circuits in accordance with the present invention.

Alternatively, terminals 37, 38 may also be formed into foot portions as shown in FIG. 5 for mounting on a thick/thin film circuit 17. As can be seen on FIG. 5 the conductive pads spacing identified as A is equal to the spacing required for mounting the DIP leads directly to the circuit conductive pads 15, 16. The complementary socket body 30 is approximately the same size overall as the DIP body 10 which is substantially smaller and less bulky than sockets presently available. Thus a low profile easily mountable socket can be used in thick/thin film circuits requiring such a device.

The present invention has been described with reference to a specific embodiment thereof, for the purpose of illustrating the manner in which the invention may be used to advantage, and it will be appreciated by those skilled in the art that the invention is not limited thereto. Accordingly, any and all modifications, variations or equivalent arrangements which may occur to those skilled in the art should be considered to be within the scope of the invention.

What is claimed is:

1. An arrangement for mounting and electrically connecting an integrated circuit package having at least two side surfaces and a lower surface, to a planar surface including conductive portions, comprising:

at least two electrical leads, each lead including a fixed end, an intermediate section and a free end, each of said fixed ends integrally mounted to a different one of said integrated circuit package side surfaces directly opposite each other and each of said intermediate sections extending vertically and in a spaced relationship to a respective side surface beyond said lower surface to a free end; and each of said free ends U-shaped in cross section including a first leg extending perpendicularly from said intermediate section parallel to said integrated circuit lower surface and a second leg parallel to said first leg;

socket means including an insulative body and at least two electrical terminals extending from the interior of said body and electrically connected to said conductive portions, and at least two openings, each of said openings extending through said body to a different one of said terminals and each of said openings formed to accept a different one of said integrated circuit free ends, with each of said free ends engaging a respective terminal, mounting and electrically connecting said integrated circuit thereat.

2. An arrangement for mounting and electrically connecting an integrated circuit package as claimed in claim 1, wherein: said socket means body is rectangular in cross-section including first and second vertical sides and each of said electrical terminals including a fixed end and a free end, each of said free ends extending outwardly from the interior of said body from a surface adjacent said first and second vertical sides and each of said electrical terminal fixed ends mounted adjacent and parallel to a different one of said socket vertical sides.

3. An arrangement for mounting and electrically connecting an integrated circuit package as claimed in claim 2, wherein: each of said openings is U-shaped in cross-section vertically arranged on a respective one of said vertical sides adjacent a different one of said fixed terminal ends and each of said openings tapers inwardly into said insulative body from a broad open mouth to a closed end formed by a respective one of said fixed terminal ends.

4. An arrangement for mounting and electrically connecting an integrated circuit package as claimed in claim 3, wherein: said integrated circuit includes a plurality of electrical leads and each of said free ends are U-shaped in cross-section.

5. An arrangement for mounting and electrically connecting an integrated circuit package as claimed in claim 4, wherein: said socket means body includes a plurality of electrical terminals extending from said body at said surface adjacent said first and second sides and a plurality of openings corresponding to and in juxtaposition with said integrated circuit free ends and each of said body openings adjacent a respective one of said electrical terminals fixed ends accepting a respective one of said integrated circuit leads free ends therein.

6. An arrangement for mounting and electrically connecting an integrated circuit package as claimed in claim 5, wherein: said planar surface conductive portions comprise a plurality of plated through bores and each electrical terminal free end is disposed to be inserted into a different one of said bores and fixedly mounted thereat.

7. An arrangement for mounting and electrically connecting an integrated circuit package as claimed in claim 5, wherein: said planar surface conductive portions comprise a plurality of conductive pads and each of said terminal free ends extend outwardly from said socket means and are formed into a horizontal foot portion and each of said foot portions disposed to be fixedly mounted to a different one of said conductive pads.

* * * * *